United States Patent
Lin et al.

(10) Patent No.: US 9,030,011 B2
(45) Date of Patent: May 12, 2015

(54) CHIP PACKAGE AND METHOD FOR FORMING THE SAME

(71) Applicant: Xintec Inc., Jhongli, Taoyuan County (TW)

(72) Inventors: Chao-Yen Lin, New Taipei (TW); Yi-Hang Lin, New Taipei (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 13/959,567

(22) Filed: Aug. 5, 2013

(65) Prior Publication Data

US 2013/0320532 A1 Dec. 5, 2013

Related U.S. Application Data

(62) Division of application No. 13/105,775, filed on May 11, 2011, now Pat. No. 8,507,321.

(60) Provisional application No. 61/333,459, filed on May 11, 2010.

(51) Int. Cl.
*H01L 23/00* (2006.01)
*H01L 21/56* (2006.01)
(Continued)

(52) U.S. Cl.
CPC .............. *H01L 24/05* (2013.01); *H01L 21/561* (2013.01); *H01L 21/6835* (2013.01); *H01L 23/3121* (2013.01); *H01L 24/13* (2013.01); *H01L 23/525* (2013.01); *H01L 29/06* (2013.01); *H01L 29/0657* (2013.01); *H01L 2221/68327* (2013.01); *H01L 2221/6834* (2013.01); *H01L 2221/68381* (2013.01); *H01L 2224/0401* (2013.01); *H01L 2224/04042* (2013.01); *H01L 2224/05558* (2013.01); *H01L 2224/16227* (2013.01); *H01L 2224/48091* (2013.01); *H01L 2224/48227* (2013.01); *H01L 2924/14* (2013.01); *H01L 2924/1461* (2013.01); *H01L 24/48* (2013.01); *H01L 2924/10253* (2013.01); *H01L 2924/12041* (2013.01); *H01L 2224/16225* (2013.01); *H01L 2224/02379* (2013.01); *H01L 2224/16105* (2013.01); *H01L 2224/02371* (2013.01);
(Continued)

(58) Field of Classification Search
CPC ........... H01L 2924/01079; H01L 2924/01078; H01L 2924/01029; H01L 2924/01013
USPC .................................................. 257/738, 773
See application file for complete search history.

(56) References Cited

U.S. PATENT DOCUMENTS 7,199,345 B1    4/2007   Meisel et al.
2006/0270089 A1   11/2006   Huang et al.

(Continued)

FOREIGN PATENT DOCUMENTS

CN            101276820       10/2008

*Primary Examiner* — Monica D Harrison
(74) *Attorney, Agent, or Firm* — Liu & Liu

(57) ABSTRACT

An embodiment of the invention provides a chip package which includes: a carrier substrate; a semiconductor substrate having an upper surface and a lower surface, disposed overlying the carrier substrate; a device region or sensing region located on the upper surface of the semiconductor substrate; a conducting pad located on the upper surface of the semiconductor substrate; a conducting layer electrically connected to the conducting pad and extending from the upper surface of the semiconductor substrate to a sidewall of the semiconductor substrate; and an insulating layer located between the conducting layer and the semiconductor substrate.

21 Claims, 5 Drawing Sheets

(51) Int. Cl.
*H01L 21/683* (2006.01)
*H01L 23/31* (2006.01)
*H01L 23/525* (2006.01)
*H01L 29/06* (2006.01)

(52) U.S. Cl.
CPC ............... *H01L2224/06167* (2013.01); *H01L 2224/02375* (2013.01); *H01L 2224/02381* (2013.01); *H01L 2224/05548* (2013.01); *H01L 2224/06165* (2013.01); *H01L 2224/73215* (2013.01); *H01L 2224/73253* (2013.01)

(56) References Cited

U.S. PATENT DOCUMENTS

2008/0001241 A1    1/2008  Tuckerman et al.
2010/0072603 A1*   3/2010  Boon et al. ................... 257/690

* cited by examiner

CHIP PACKAGE AND METHOD FOR FORMING THE SAME

CROSS REFERENCE TO RELATED APPLICATIONS

This Application is a Divisional of U.S. application Ser. No. 13/105,775, filed on May 11, 2011 and entitled "CHIP PACKAGE AND METHOD FOR FORMING THE SAME", which claims the benefit of U.S. Provisional Application No. 61/333,459, filed on May 11, 2010, the entirety of which are incorporated by reference herein.

BACKGROUND OF THE INVENTION

1. Field of the Invention

The present invention relates to a chip package and forming method thereof, and in particular relates to a chip package of a sensing chip.

2. Description of the Related Art

Conventional manufacturing processes of chip packages concern a plurality of patterning processes and material deposition processes, which not only cost a lot, but also require long processing time.

Therefore, a simplified and fast chip packaging technique is desired.

BRIEF SUMMARY OF THE INVENTION

An embodiment of the invention provides a chip package which includes: a carrier substrate; a semiconductor substrate having an upper surface and a lower surface, disposed overlying the carrier substrate; a device region or sensing region located on the upper surface of the semiconductor substrate; a conducting pad located on the upper surface of the semiconductor substrate; a conducting layer electrically connected to the conducting pad and extending from the upper surface of the semiconductor substrate to a sidewall of the semiconductor substrate; and an insulating layer located between the conducting layer and the semiconductor substrate.

An embodiment of the invention provides a method for forming a chip package, which includes: providing a semiconductor substrate having an upper surface and a lower surface, wherein the semiconductor substrate comprises at least a device region or sensing region and at least a conducting pad on the upper surface of the semiconductor substrate; providing a carrier substrate and disposing the semiconductor substrate overlying the carrier substrate; forming a recess from the upper surface of the semiconductor substrate; forming an insulating layer overlying the upper surface of the semiconductor substrate and within the recess; forming a conducting layer overlying the insulating layer, wherein the conducting layer is electrically connected to the conducting pad and extends from the upper surface of the semiconductor substrate to a sidewall of the semiconductor substrate; and dicing the carrier substrate from a bottom of the recess to form a plurality of separate chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a sensing chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC chips.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
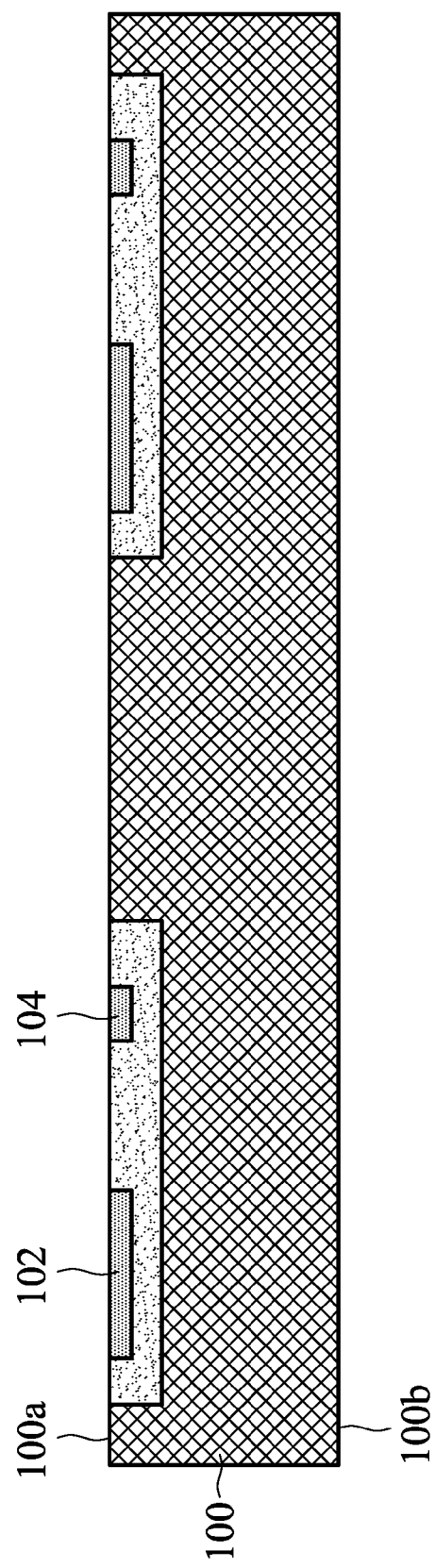
FIGS. 1A-1D are cross-sectional views showing the steps of forming a chip package in accordance with an embodiment of the present invention.

FIGS. 1A-1D are cross-sectional views showing the steps of forming a chip package according to an embodiment of the present invention. As shown in FIG. 1A, a semiconductor substrate 100 is provided, which includes an upper surface 100a and a lower surface 100b. The semiconductor substrate 100 is, for example, a silicon substrate. In one embodiment, the semiconductor substrate 100 is a silicon wafer which is suitable for the proceeding of a wafer-level packaging.

As shown in FIG. 1A, a device region or sensing region 102 is formed in the semiconductor substrate 100. In one embodiment, the semiconductor substrate 100 includes a plurality of device regions or sensing regions 102 therein. In one embodiment, the device region or sensing region 102 is, for example, a sensing region such as a fingerprint recognition region. The device region or sensing region 102 is located on the upper surface 100a of the semiconductor substrate 100. In one embodiment, the device region or sensing region 102 may be partially formed above the upper surface 100a of the semiconductor substrate 100. Alternatively, in another embodiment, the device region or sensing region 102 is completely formed in the semiconductor substrate 100 and exposed at the upper surface 100a thereof.

As shown in FIG. 1A, the semiconductor substrate 100 further includes a conducting pad 104 thereon. Typically, the conducting pad 104 is electrically connected to the device region or sensing region 102 through an interconnection (not shown).

Figure 1B:
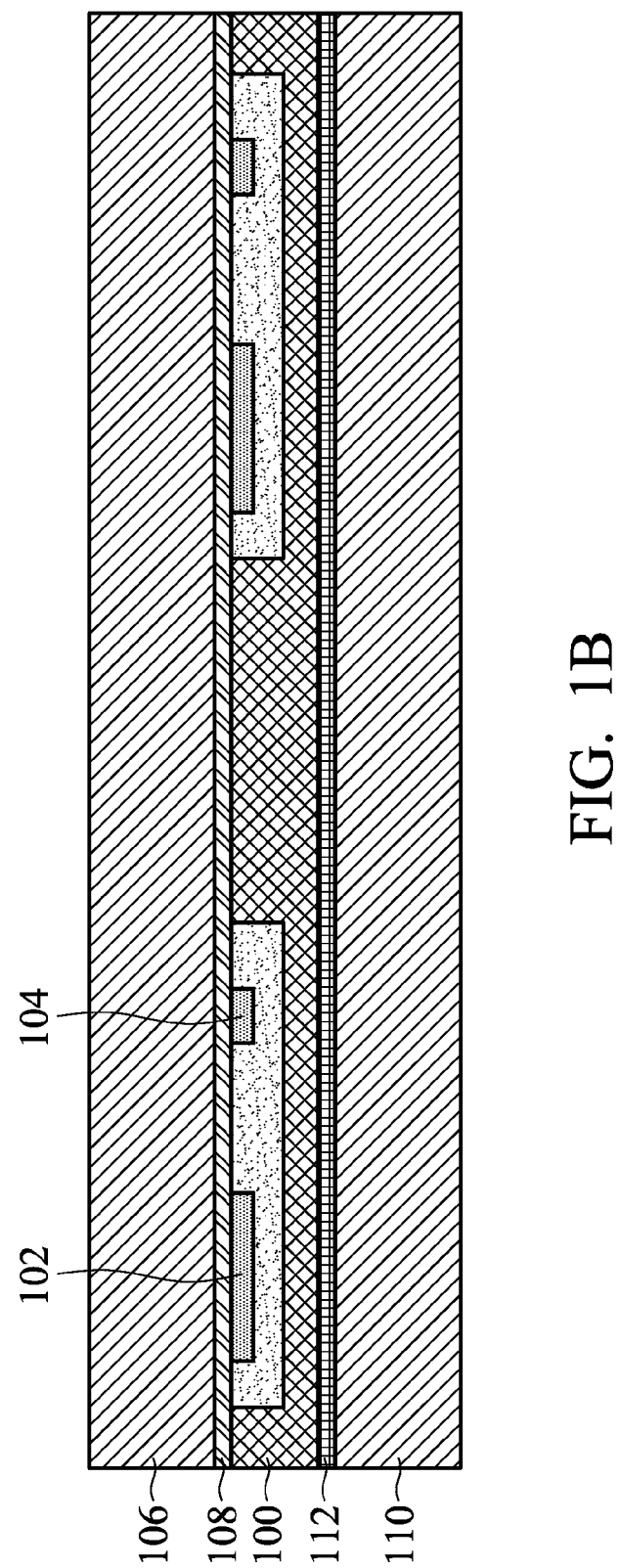

Next, the semiconductor substrate 100 may be optionally thinned to facilitate following manufacturing processes. For example, as shown in FIG. 1B, in one embodiment, a temporary substrate 106 may be disposed overlying the upper surface 100a of the semiconductor substrate 100. For example, the temporary substrate 106 may be fixed on the upper surface 100a of the semiconductor substrate 100 by an adhesion layer 108. Then, a thinning process including, for example, a mechanical grinding process or a chemical mechanical polishing process, may be performed to the lower surface 100b of the semiconductor substrate 100 by using the temporary substrate 106 as a support. In one embodiment, the temporary substrate 106 may be a glass substrate or a silicon wafer.

As shown in FIG. 1B, after the temporary substrate 106 is optionally disposed and the thinning process of the semiconductor substrate 100 is optionally performed, a carrier substrate 110 is disposed overlying the lower surface 100b of the semiconductor substrate 100. In one embodiment, the carrier substrate 110 may be a semiconductor substrate or a glass substrate.

Figure 1C:
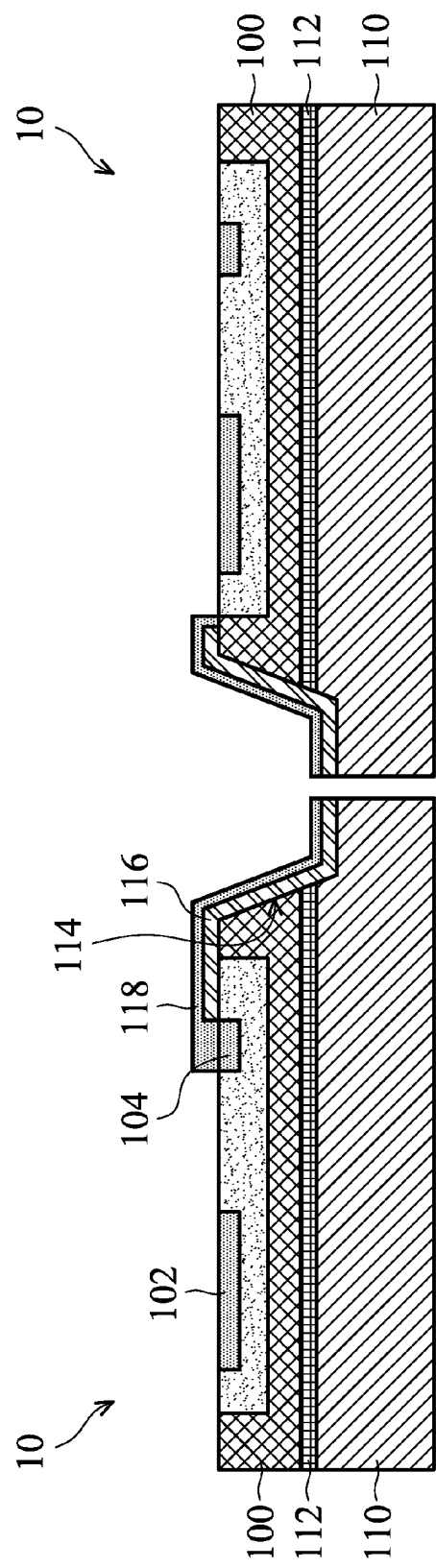

Next, as shown in FIG. 1C, the temporary substrate 106 is removed. In one embodiment, the adhesion layer 108 under the temporary substrate 106 is completely removed from the upper surface 100a of the semiconductor substrate 100. In this case, the device region or sensing region 102 is substantially and directly exposed without any other material layer formed thereon.

Next, a recess (or notch) 114 is formed along a direction from the upper surface 100a towards the lower surface 100b of the semiconductor substrate 100. In one embodiment, the recess 114 completely penetrates the semiconductor substrate 100 and extends into the carrier substrate 110. Then, an insulating material is deposited overlying the upper surface 100a and a sidewall and a bottom of the recess 114 and is patterned to be an insulating layer 116. Then, a patterned conducting layer 118 is formed overlying the insulating layer 116.

As shown in FIG. 1C, the conducting layer 118 is electrically connected to the conducting pad 104 and extends from the upper surface 100a of the semiconductor substrate 100 to the sidewall and the bottom of the recess 114. If the recess 114 penetrates the semiconductor substrate 100 and extends into the carrier substrate 110, the conducting layer 118 and the insulating layer 116 are further extended into the carrier substrate 110. In addition, in one embodiment, in the carrier substrate 110, a portion of the conducting layer 118 and the insulating layer 116 are substantially horizontally disposed. That is, they are substantially parallel to the upper surface 100a of the semiconductor substrate 100. This is due to the fact that, in one embodiment, the bottom of the formed recess 114 is substantially parallel to the upper surface 100a of the semiconductor substrate 100.

Next, as shown in FIG. 1C, in one embodiment, the carrier substrate 110 is diced from the bottom of the recess 114 to form a plurality of separate chip packages 10. Because the conducting layer 118, electrically connected to the conducting pad 104, extends overlying a sidewall of the chip package 10 (that is, extend from the upper surface 100a of the semiconductor substrate 100 to a sidewall of the semiconductor substrate 100), the conducting path may be led downwardly from the upper surface 100a of the semiconductor substrate 100 through the sidewall. In one embodiment, during the packaging process of the chip package 10, only two patterning processes are performed (that is, the patterning process of the insulating layer 116 and the patterning process of the conducting layer 118), which significantly simplifies the packaging process of the chip package and reduces fabrication time and cost. In addition, because the packaging process of the chip is significantly simplified, reliability of the formed chip package is also improved.

Figure 1D:
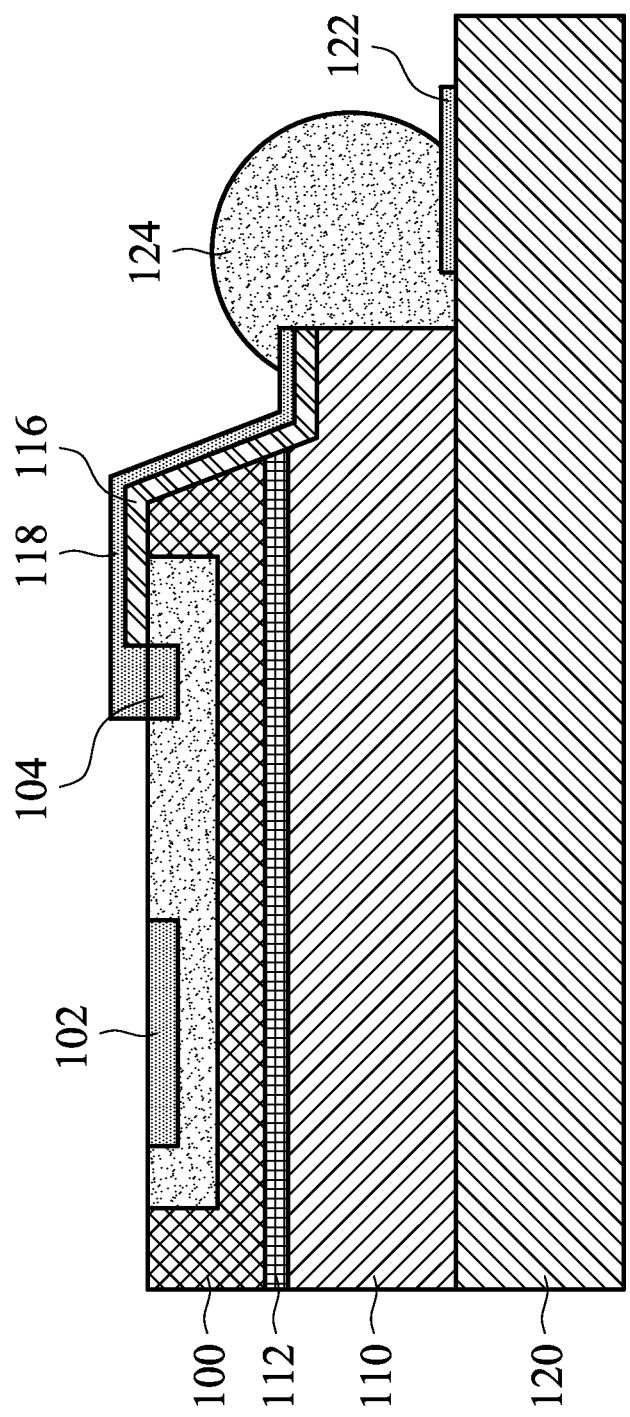

As shown in FIG. 1D, in one embodiment, the formed chip package 10 may be further disposed overlying a circuit board 120. In one embodiment, the circuit board 120 includes a contact pad 122 thereon, which is electrically connected to wires in the circuit board 120 and serves as a contact point with the device region or sensing region 102 in the chip package. As shown in the embodiment in FIG. 1D, a solder ball 124 may be formed on a corner between the carrier substrate 110 and the circuit board 120. The solder ball 124 is electrically connected to the conducting layer 118 and the contact pad 122 simultaneously, forming a conducting path between the conducting layer 118 and the contact pad 122.

Figure 2:
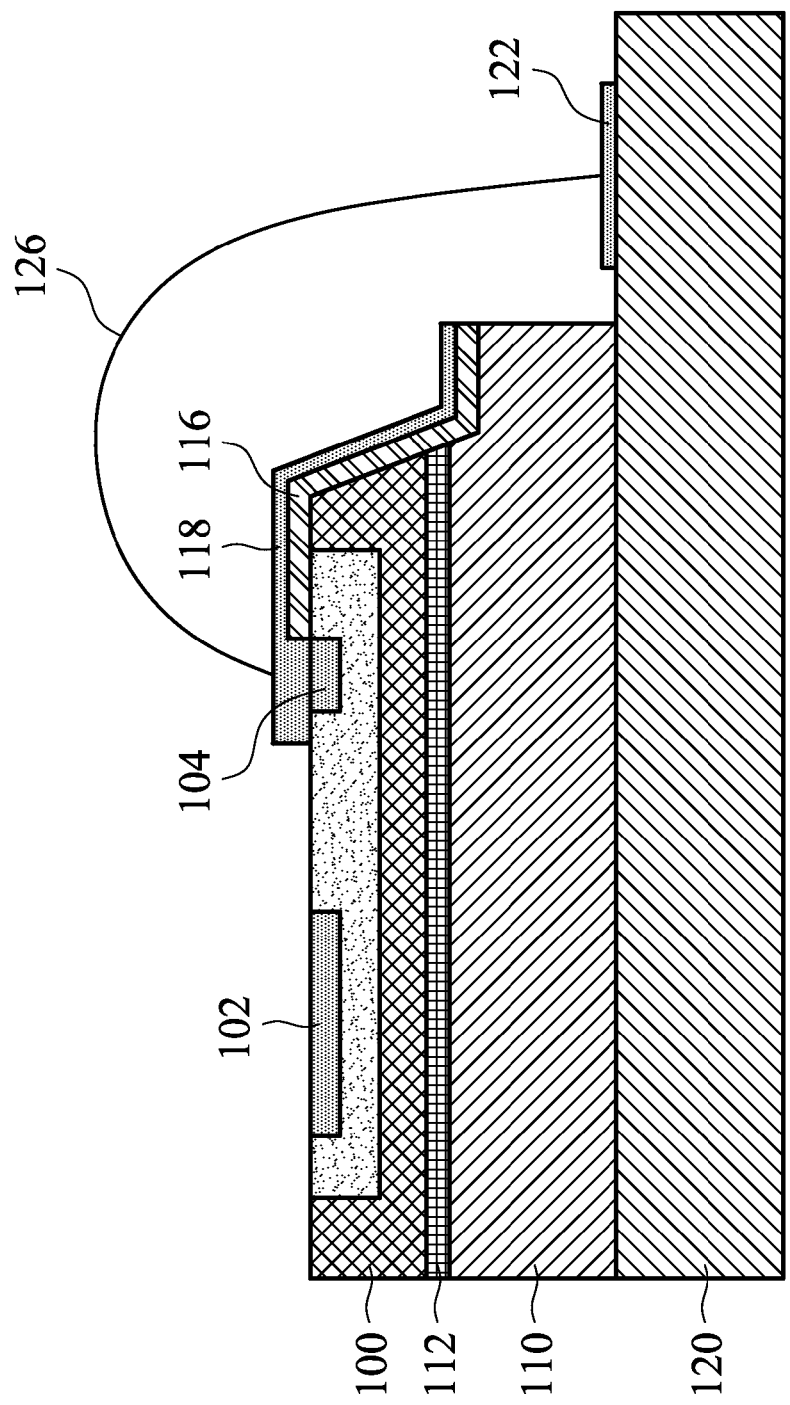
FIG. 2 is a cross-sectional view showing a chip package in accordance with an embodiment of the present invention.

It should be appreciated that embodiments of the invention are not limited to adopt the solder ball 124 to form the conducting path between the device region or sensing region 102 and the circuit board 120. In another embodiment, another conducting structure such as a conducting layer, conducting bump, or solder wire may be adopted to replace the solder ball 124. For example, in the embodiment shown in FIG. 2, a solder wire 126 is used to replace the solder ball 124. Thus, any conducting structure suitable for forming the conducting path between the contact pad 122 and the conducting layer 118 is within the scope of the embodiments of the present invention.

In the embodiment of the invention, a recess is formed on a front surface of the chip (that is, a same side that the device region or sensing region is formed on) and a conducting layer electrically connecting the device region or sensing region is formed along a sidewall of the recess. The desired conducting wire may be successfully formed and the required patterning process steps of the chip packaging process may be largely reduced. Thus, fabrication time and costs are significantly reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A chip package, comprising:
a lower substrate;
an upper substrate having an upper surface and a lower surface, disposed overlying the lower substrate;
a recess adjacent to a sidewall of the upper substrate, wherein the recess is formed along a direction from the upper surface toward the lower surface of the upper substrate;

a device region or sensing region located on the upper surface of the upper substrate;

a conducting pad located on the upper surface of the upper substrate; and a conducting layer electrically connected to the conducting pad and extending to the recess along the sidewall of the upper substrate.

2. The chip package as claimed in claim 1, wherein the sidewall of the upper substrate inclines toward the upper surface of the upper substrate.

3. The chip package as claimed in claim 1, wherein the conducting pad is between the recess and the device region or sensing region.

4. The chip package as claimed in claim 1, wherein the conducting layer is further extends on a bottom of the recess.

5. The chip package as claimed in claim 4, wherein the bottom of the recess is located overlying a surface of the lower substrate and substantially parallel to the upper surface of the upper substrate.

6. The chip package as claimed in claim 5, further comprising an insulating layer located between the conducting layer and the upper substrate and/or between the conducting layer and the lower substrate.

7. The chip package as claimed in claim 5, further comprising a circuit board, wherein the conducting layer is electrically connected to a contact pad on the circuit board through a conducting structure.

8. The chip package as claimed in claim 7, wherein the conducting structure comprises a solder ball or a solder wire.

9. The chip package as claimed in claim 8, wherein the conducting structure is disposed between the contact pad of the circuit board and the upper surface of the upper substrate.

10. The chip package as claimed in claim 8, wherein a portion of the conducting structure is above a surface of the device region or sensing region located on the upper surface of the upper substrate.

11. A chip package, comprising:

a carrier substrate;

a semiconductor substrate having an upper surface and a lower surface, disposed overlying the carrier substrate;

a device region or sensing region located in the semiconductor substrate;

a conducting pad located on the upper surface of the semiconductor substrate; and a conducting layer electrically connected to the conducting pad and extending from the upper surface to a sidewall of the semiconductor substrate, wherein the sidewall of the semiconductor substrate inclines toward the upper surface of the semiconductor substrate.

12. The chip package as claimed in claim 11, wherein the device region or sensing region comprises a fingerprint recognition region.

13. The chip package as claimed in claim 11, wherein the conducting layer further extends on a surface of the carrier substrate, wherein the surface of the carrier substrate is substantially parallel to the upper surface of the upper substrate.

14. The chip package as claimed in claim 13, further comprising a circuit board, wherein the carrier substrate is disposed overlying the circuit board, and the conducting layer is electrically connected to a contact pad on the circuit board through a conducting structure.

15. The chip package as claimed in claim 14, wherein the conducting structure comprises a solder ball or a solder wire.

16. The chip package as claimed in claim 15, wherein the conducting structure is a solder wire, and a portion of the solder wire is above the upper surface of the semiconductor substrate.

17. The chip package as claimed in claim 14, wherein the conducting structure is disposed between the contact pad of the circuit board and the upper surface of the semiconductor substrate.

18. A chip package, comprising:

a chip including a semiconductor substrate overlying a carrier substrate;

a fingerprint recognition region and a conducting pad located on a front surface of the chip;

a recess formed on the front surface of the chip;

a conducting layer electrically connected to the conducting pad, wherein the conducting layer is further formed along a sidewall of the recess; and a circuit board having a contact pad, wherein the conducting layer is electrically connected to the contact pad on the circuit board through a conducting structure.

19. The chip package as claimed in claim 18, wherein the conducting structure is disposed between the contact pad of the circuit board and the front surface of the chip.

20. The chip package as claimed in claim 19, wherein the conducting structure comprises a solder ball or a solder wire.

21. The chip package as claimed in claim 20, wherein the conducting pad is located between the fingerprint recognition region and the recess.

* * * * *